United States Patent
Park et al.

(10) Patent No.: US 11,462,142 B2
(45) Date of Patent: Oct. 4, 2022

(54) SLEW RATE BOOSTING CIRCUIT, SOURCE DRIVER CHIP AND DISPLAY DEVICE

(71) Applicants: Beijing ESWIN Computing Technology Co., Ltd., Beijing (CN); Hefei ESWIN IC Technology Co., Ltd., Hefei (CN)

(72) Inventors: Sangmin Park, Beijing (CN); Jangjin Nam, Beijing (CN)

(73) Assignees: Beijing ESWIN Computing Technology Co., Ltd.; Hefei ESWIN IC Technology Co., Ltd.

( * ) Notice: Subject to any disclaimer, the term of this patent is extended or adjusted under 35 U.S.C. 154(b) by 0 days.

(21) Appl. No.: 17/431,621

(22) PCT Filed: May 19, 2021

(86) PCT No.: PCT/CN2021/094639
§ 371 (c)(1),
(2) Date: Aug. 17, 2021

(87) PCT Pub. No.: WO2022/127023
PCT Pub. Date: Jun. 23, 2022

(65) Prior Publication Data
US 2022/0189365 A1    Jun. 16, 2022

(30) Foreign Application Priority Data
Dec. 14, 2020    (CN) .......................... 202011476679.3

(51) Int. Cl.
*H03K 5/00*    (2006.01)
*G09G 3/20*    (2006.01)
(Continued)

(52) U.S. Cl.
CPC .............. *G09G 3/20* (2013.01); *H03K 3/037* (2013.01); *H03K 5/12* (2013.01);
(Continued)

(58) Field of Classification Search
None
See application file for complete search history.

(56) References Cited

U.S. PATENT DOCUMENTS

| 10,452,088 B1 | 10/2019 | Chien |
| 2004/0036670 A1 | 2/2004 | Chung |

(Continued)

FOREIGN PATENT DOCUMENTS

| CN | 1485810 A | 3/2004 |
| CN | 101630943 A | 1/2010 |

(Continued)

OTHER PUBLICATIONS

International Search Report for PCTCN2021094639 dated Sep. 15, 2021, 5 pgs.

*Primary Examiner* — Tuan T Lam
(74) *Attorney, Agent, or Firm* — Lerner, David, Littenberg, Krumholz & Mentlik, LLP (57) ABSTRACT

A slew rate boosting circuit, a source driver chip and a display device are provided in the present disclosure. The slew rate boosting circuit comprises: a first latch configured to receive and store first data; a second latch configured to receive and store second data, the second data being next to the first data; a first level shifter; an amplifier; and a slew rate boosting module configured to receive a high voltage data signal as current input data, and adjust a slew rate of an output stage of the amplifier according to a value of a specified bit of the first data, a value of a specified bit of the second data and the current input data.

20 Claims, 4 Drawing Sheets (51) Int. Cl.
*H03K 3/037* (2006.01)
*H03K 5/12* (2006.01)
*H03K 19/21* (2006.01)

(52) U.S. Cl.
CPC ............... *G09G 2310/0289* (2013.01); *G09G 2310/0291* (2013.01); *H03K 19/21* (2013.01)

(56) References Cited

U.S. PATENT DOCUMENTS

| | | | |
|---|---|---|---|
| 2005/0259058 A1* | 11/2005 | Yamaguchi .......... | G09G 3/3688 345/87 |
| 2007/0067693 A1* | 3/2007 | Okuzono ............... | G09G 3/006 714/742 |
| 2008/0001944 A1* | 1/2008 | Chang .................. | G09G 3/3688 345/214 |
| 2010/0007420 A1 | 1/2010 | Nishimura et al. | |
| 2012/0026152 A1* | 2/2012 | Chung ................. | G09G 3/3688 345/212 |
| 2012/0038614 A1* | 2/2012 | Mizumaki ............ | G09G 3/3614 345/211 |
| 2012/0075279 A1* | 3/2012 | Ishida ............. | H03K 19/018521 327/108 |
| 2012/0249244 A1* | 10/2012 | Chen .................... | G09G 3/3674 330/253 |
| 2012/0274493 A1* | 11/2012 | Yang ..................... | H03M 1/108 341/120 |
| 2013/0286002 A1 | 10/2013 | Huang | |
| 2016/0104415 A1* | 4/2016 | Yeo ....................... | G09G 3/3685 345/212 |
| 2019/0088229 A1* | 3/2019 | Morita ................. | G09G 3/3688 |
| 2020/0066759 A1* | 2/2020 | Oh .................... | H01L 29/41775 |

FOREIGN PATENT DOCUMENTS

| | | |
|---|---|---|
| CN | 102346998 A | 2/2012 |
| CN | 103377627 A | 10/2013 |
| CN | 103731109 A | 4/2014 |
| CN | 111613184 A | 9/2020 |
| CN | 112542125 A | 3/2021 |

* cited by examiner

SLEW RATE BOOSTING CIRCUIT, SOURCE DRIVER CHIP AND DISPLAY DEVICE

CROSS-REFERENCE TO RELATED APPLICATIONS

The present application is a national phase entry under 35 U.S.C. § 371 of International Application No. PCT/CN2021/094639, filed May 19, 2021, which claims priority from Chinese Patent Application No. 202011476679.3, filed Dec. 14, 2020, all of which are incorporated herein by reference.

TECHNICAL FIELD

The present disclosure relates to the field of display driving, and in particular, to a slew rate boosting circuit, a source driver chip and a display device.

BACKGROUND ART

Source Driver IC of a display screen drives pixels of a panel by reconstructing an input digital signal into an analog signal by a Digital-Analog Converter (DAC). As the resolution of the display screen increases, the number of the pixels increases, so the number of the pixels that need to be driven in the same time increases resulting in the time taken to drive each of the pixels to be shorter; and as the image increases, the capacitance of the screen increases, and the time taken to drive the pixels increases. Due to this, a voltage conversion rate (i.e. a slew rate) output in the Source Driver IC of the display panel is slowed down, which leads to an abnormal image quality and an increase in the IC temperature.

SUMMARY OF THE INVENTION

The embodiments provide a slew rate boosting circuit, a source driver chip and a display device.

For this purpose, the technical solutions employed by the present disclosure are as follows:

In an aspect, an embodiment of the present disclosure provides a slew rate boosting circuit, comprising:

a first latch configured to receive and store first data;

a second latch configured to receive and store second data, the second data being next to the first data;

a first level shifter configured to boost the first data to obtain a high voltage data signal;

an amplifier; and a slew rate boosting module connected to the amplifier, the first level shifter, the first latch and the second latch, and configured to receive the high voltage data signal as current input data, and adjust a voltage of an output stage of the amplifier to boost a slew rate of the output stage of the amplifier according to a value of a specified bit of the first data, a value of a specified bit of the second data and the current input data.

Optionally, the slew rate boosting module comprises:

a pattern detection module connected to the first latch and the second latch, and configured to determine whether the slew rate of the output stage of the amplifier needs to be boosted according to the value of the specified bit of the first data and the value of the specified bit of the second data, and output a Proportional-Differential (PD) control signal according to the determined result; and a charging module connected to an output terminal of the pattern detection module, an output terminal of the first level shifter and a charging voltage terminal, and configured to determine whether the slew rate of the output stage of the amplifier needs to be boosted according to the PD control signal and the current input data, and determine a charging voltage input to the output stage of the amplifier when determining that the slew rate of the output stage of the amplifier needs to be boosted.

Optionally, the pattern detection module comprises:

an XOR gate circuit, a D flip-flop and a second level shifter;

an input terminal of the XOR gate circuit is connected to the first latch and the second latch, and configured to determine whether the value of the specified bit of the first data and the value of the specified bit of the second data input therein are equal, and out the determined result;

an output terminal of the XOR gate circuit is connected to a D terminal of the D flip-flop, and an input terminal of the second level shifter is connected to a Q terminal of the D flip-flop, and the second level shifter is configured to determine whether the slew rate of the output stage of the amplifier needs to be boosted according to the determined result of the XOR gate circuit, wherein:

when the value of the specified bit of the first data and the value of the specified bit of the second data are not equal, a determined result indicating that the slew rate of the output stage of the amplifier needs to be boosted is obtained and output;

when the value of the specified bit of the first data and the value of the specified bit of the second data are equal, a determined result indicating that the slew rate of the output stage of the amplifier does not need to be boosted is obtained and output;

an output terminal of the second level shifter is connected to the charging module, and configured to provide the PD control signal to the charging module.

Optionally, the value of the specified bit of the first data and the value of the specified bit of the second data comprise:

a value $D1\langle x\rangle$ of an x-th bit of the first data, and a value $D2\langle x\rangle$ of an x-th bit of the second data.

Optionally, the x-th bit are respectively the Most Significant Bits of the first data and the second data.

Optionally, the charging module comprises a first control switch set and a second control switch set;

the first control switch set is connected to a VDD voltage terminal, and connected to a OUTN port of the output stage of the amplifier after being connected to a first Proportional-Differential (PD) control switch in series;

the second control switch set is connected to a VSS voltage terminal, and connected to a OUTP port of the output stage of the amplifier after being connected to a second PD control switch in series;

the first PD control switch and the second PD control switch are configured to be closed and open according to a value of the PD control signal;

the first control switch set comprises multiple switches connected in series, and each of the switches is configured to be closed or open according to whether the current input data belongs to an enable range of the slew rate boosting module;

the second control switch set comprises multiple switches connected in series, and each of the switches is configured to be closed or open according to whether inverted data of the current input data belongs to the enable range of the slew rate boosting module.

Optionally, the charging module further comprises first and second Fast Internal-node Charging (FIC) control switches;

wherein the first FIC control switch, the first control switch set and the first PD control switch are connected in series between the VDD voltage terminal and the OUTN port of the output stage of the amplifier;

the second FIC control switch, the second control switch set and the second PD control switch are connected in series between the VSS voltage terminal and the OUTP port of the output stage of the amplifier;

the first FIC control switch and the second FIC control switch are controlled to be closed or open according to a FIC signal input from the outside; and the FIC signal is set according to a use state of the slew rate boosting circuit.

In an aspect, an embodiment of the present disclosure provides a slew rate boosting method applied to the slew rate boosting circuit provided in the embodiment of the present disclosure, and comprising:

receiving first data and second data, the second data being next to the first data; and adjusting a voltage of an output stage of the amplifier to boost a slew rate of the output stage of the amplifier according to a value of a specified bit of the first data, a value of a specified bit of the second data and the current input data.

Optionally, the adjusting of the voltage of the output stage of the amplifier to boost the slew rate of the output stage of the amplifier further comprises:

when the value of the specified bit of the first data and the value of the specified bit of the second data are not equal, determining that the slew rate of the output stage of the amplifier needs to be boosted;

when the value of the specified bit of the first data and the value of the specified bit of the second data are equal, determining that the slew rate of the output stage of the amplifier does not need to be boosted.

Optionally, the adjusting of the voltage of the output stage of the amplifier to boost the slew rate of the output stage of the amplifier further comprises:

when the slew rate of the output stage of the amplifier needs to be boosted, if the current input data belongs to the enable range of the slew rate boosting module, determining a charging voltage input to the output stage of the amplifier.

In an aspect, an embodiment of the present disclosure provides a slew rate boosting device, comprising:

a first receiving module configured to receive first data and second data, the second data being next to the first data; and a first process module configured to adjust a voltage of an output stage of the amplifier to boost a slew rate of the output stage of the amplifier according to a value of a specified bit of the first data, a value of a specified bit of the second data and the current input data.

In an aspect, an embodiment of the present disclosure provides an electronic device, comprising: a processor and a memory which stores computer instructions that, when executed by the processor, cause the processor perform the slew rate boosting method provided according to any one of embodiments of the present disclosure.

In an aspect, an embodiment of the present disclosure provides a source driver chip comprising the slew rate boosting circuit provided according to any one of embodiments of the present disclosure.

In an aspect, an embodiment of the present disclosure provides a display device comprising the source driver chip provided according to the embodiments of the present disclosure.

DETAILED DESCRIPTION OF THE PREFERRED EMBODIMENT

In order to make the purposes, technical solutions, and advantages of the embodiments of the present disclosure clearer, the technical solutions of the embodiments of the present disclosure will be described clearly and completely in conjunction with the accompanying drawings of the embodiments of the present disclosure. Obviously, the described embodiments are part of the embodiments of the present disclosure, rather than all of the embodiments. Based on the described embodiments of the present disclosure, all other embodiments obtained by those of ordinary skill in the art without creative work shall fall within the protection scope of the present disclosure.

The terms "first", "second", etc. in the description and claims of the present disclosure are used to distinguish similar objects, but not to describe a specific sequence or orders. It should be understood that the data used in this way can be interchanged under appropriate circumstances, so that the embodiments of the present disclosure can be implemented in an order other than those illustrated or described here, and the "first", "second", etc. are usually used to distinguish the objects of the same type, and the number of objects is not limited. For example, the first object may be one or more. In addition, "and/or" in the description and claims means at least one of the connected objects, and the character "l" generally means that the associated objects before and after are in an "or" relationship.

In addition, the technical features involved in the different embodiments of the present disclosure described below can be combined with each other as long as they do not conflict with each other.

Figure 1:
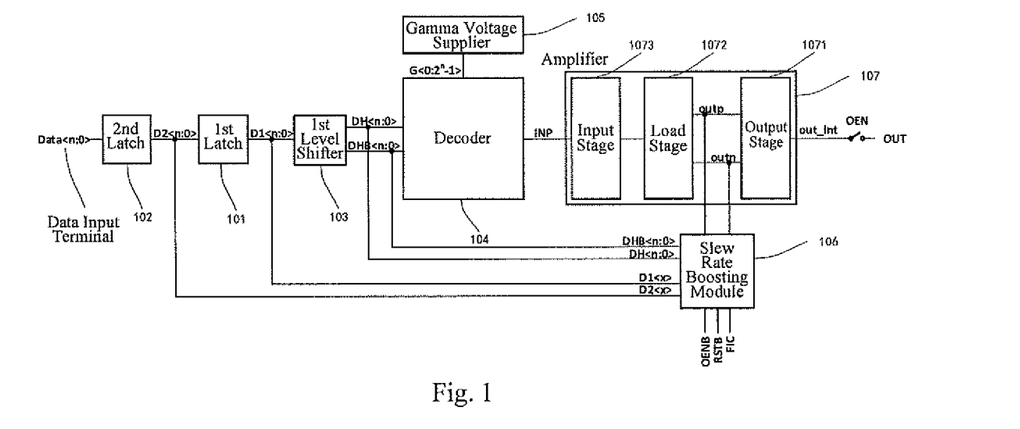
FIG. 1 is a schematic structural diagram of a slew rate boosting circuit according to an example embodiment.

Referring to FIG. 1 illustrating a schematic diagram of a slew rate boosting circuit according to an example embodiment, a slew rate boosting module is added to a display driver circuit in the slew rate boosting circuit provided in the disclosure, and a slew rate of an output stage of an amplifier may be adjusted according to data Data<n:0> input to the DAC, so as to improve the slew rate of the output stage of the amplifier. The slew rate is the voltage conversion rate.

Referring to FIG. 1, the slew rate boosting circuit comprises:

a first latch 101, a second latch 102, a first level shifter 103, a slew rate boosting module 106 and an amplifier 107;

the first latch 101 is configured to store first data received;

the second latch 102 is configured to store second data received, and the second data is next to the first data;

the first level shifter 103 is configured to boost the first data, and a high voltage data signal obtained by the boosting is used as current input data of the slew rate boosting module 106;

the slew rate boosting module 106 is connected to the amplifier 107, the first level shifter 103, the first latch 101 and the second latch 102, and configured to adjust a voltage of an output stage 1071 of the amplifier to enhance a slew rate of the output stage of the amplifier according to a value of a specified bit of the first data, a value of a specified bit of the second data and the current input data.

Specifically, if the slew rate of the output stage 1071 of the amplifier needs to be enhanced, a charging voltage input to the output stage 1071 of the amplifier may be determined.

The slew rate boosting circuit provided in the disclosure may implement the adjustment of the slew rate of the output stage of the amplifier according to the first data, the second data and the current input data of the slew rate boosting module, wherein if the slew rate of the output stage of the amplifier needs to be enhanced, the charging voltage input to the output stage of the amplifier may be determined, wherein the second data is next to the first data. The solution may implement a fast conversion of output voltage without increasing static current of the amplifier while keep the IC temperature stable.

Figure 2:
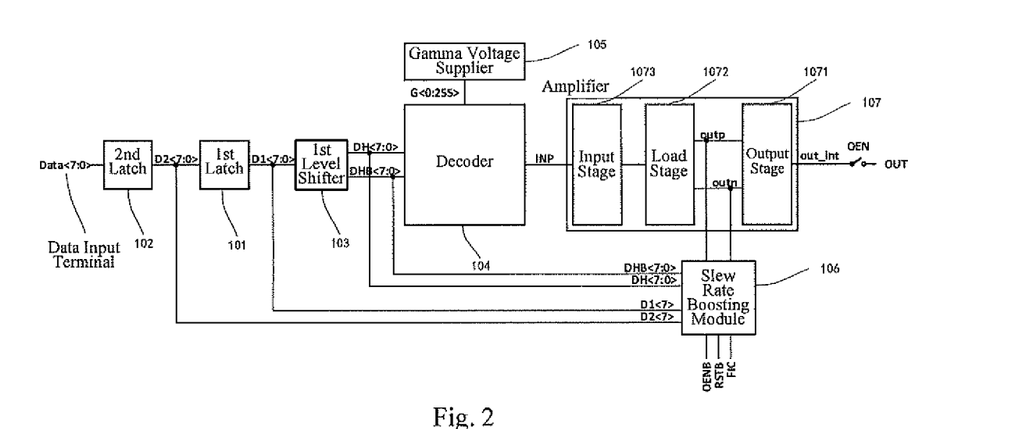
FIG. 2 is a schematic structural diagram of a slew rate boosting circuit of an 8-bits source code driver IC according to an example embodiment.

Specifically, taking that an 8-bits DAC is a data input terminal as an example, and referring to FIG. 2 illustrating structure diagram of the slew rate boosting circuit of the 8-bits source code driver IC, an operation mode of the slew rate boosting circuit provided in the disclosure will be described as follows:

the first latch 101 stores and outputs the first data D1<7:0> in binary, the second latch 102 stores and outputs the second data D2<7:0> in binary, the first level shifter 103 boosts the input data D1<7:0>, obtains the high voltage data signal DH<7:0> and an inverted signal DHB<7:0>, and outputs DH<7:0> and DHB<7:0> to a decoder 104 and the slew rate boosting module 106, and here, DH<7:0> is the current input data of the slew rate boosting module, and DHB<7:0> is inverted data of the current input data of the slew rate boosting module.

Specifically, the value of the specified bit of the first data and the value of the specified bit of the second data may be one value, for example, a value D1<x> of a x-th bit of the first data and a value D2<x> of a x-th bit of the second data may be specified; or may also be values of multiple specified bits, for example, a value D1<7> of a 7-th bit of the first data and a value D2<7> of a 7-th bit of the second data, and a value D1<6> of a 6-th bit of the first data and a value D2<6> of a 6-th bit of the second data, so as to improve accuracy; referring to FIG. 2, the values of the specified bits are the value D1<7> of the 7-th bit of the first data and the value D2<7> of the 7-th bit of the second data.

It should be noted, all of <7:0> s marked in FIG. 2 (the same in other FIGS) are data in binary, since the example of FIG. 2 is 8 bits, the involved binary data is 8-bits binary data which are 0-th bit through 7-th bit, respectively, and D1<x> and D2<x> start from the 0-th bit.

Figure 3:
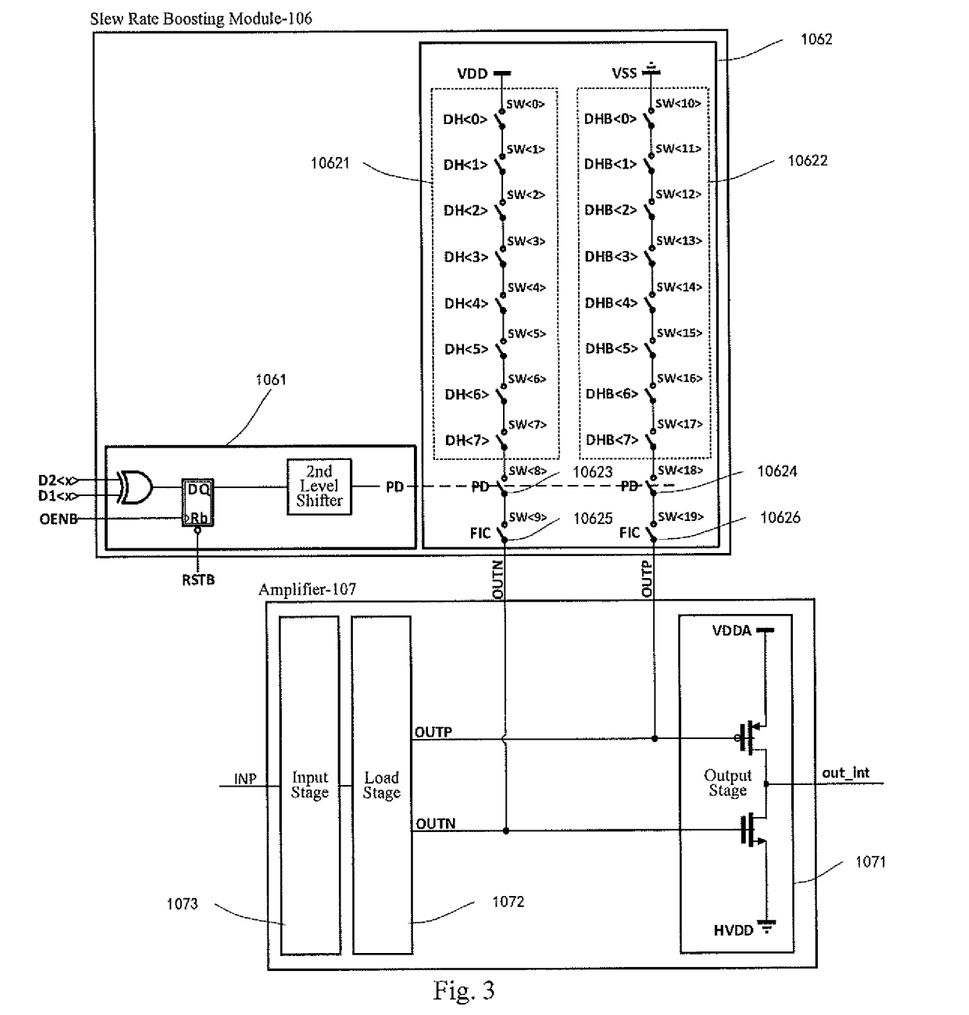
FIG. 3 is a schematic structural diagram of a slew rate boosting circuit according to an example embodiment.
Figure 4:
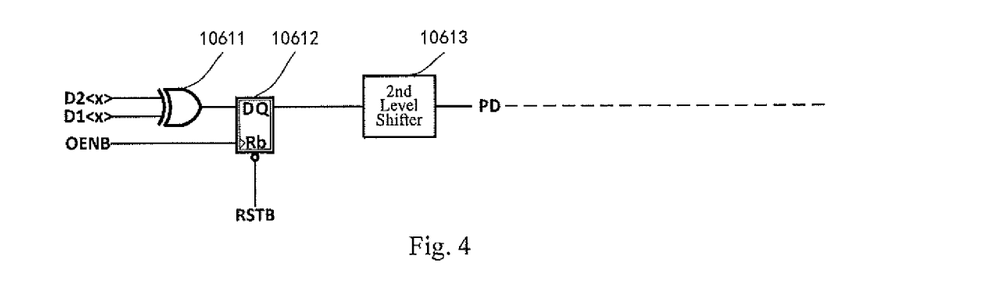
FIG. 4 is a schematic structural diagram of a slew rate boosting circuit according to an example embodiment.

Optionally, referring to FIG. 3, the slew rate boosting module 106 comprises:

a pattern detection module 1061 connected to the first latch 101 and the second latch 102, and configured to determine whether the slew rate of the output stage 1071 of the amplifier needs to be boosted according to the value of the specified bit of the first data and the value of the specified bit of the second data, and output a Proportional-Differential (PD) control signal according to the determined result; and a charging module 1062 connected to an output terminal of the pattern detection module 1061, an output terminal of the first level shifter 103 and a charging voltage terminal, and configured to determine whether the slew rate of the output stage 1071 of the amplifier needs to be boosted according to the PD control signal and the current input data, and determine a charging voltage input to the output stage 1071 of the amplifier when determining that the slew rate of the output stage 1071 of the amplifier needs to be boosted.

Specifically, the function of the pattern detection module 1061 is to compare whether D1<x> and D2<x> are the same, and if the two are the same, it means there is a little change between the first data and the second data and the slew rate (i.e. the voltage conversion rate) does not need to be boosted, and exemplarily, the value of the PD control signal is 0;

if D1<x> and D2<x> are different from each other, it means there is a big change between the first data and the second data and the slew rate needs to be boosted; as an example, the value of the PD control signal is 1; and whether the slew rate needs to be boosted finally, it needs to be further determined by the charging module 1062 according to the PD control signal and the current input data, when PD=1 and when the current input data belongs to an enable range of the charging module 1062, the slew rate of the output stage 1071 of the amplifier needs to be boosted, and the charging voltage input to the output stage 1071 of the amplifier is determined by the charging module 1062.

Optionally, the pattern detection module 1061 comprises:

an XOR gate circuit 10611, a D flip-flop 10612 and a second level shifter 10613;

an input terminal of the XOR gate circuit 10611 is connected to the first latch 101 and the second latch 102, and the XOR gate circuit 10611 is configured to determine whether the value of the specified bit of the first data and the value of the specified bit of the second data input therein are equal, and out the determined result;

an output terminal of the XOR gate circuit 10611 is connected to a D terminal of the D flip-flop 10612, and an input terminal of the second level shifter 10613 is connected to a Q terminal of the D flip-flop 10612, the second level shifter 10613 is configured to determine whether the slew rate of the output stage 1071 of the amplifier needs to be boosted according to the determined result of the XOR gate circuit 10611, wherein:

when the value of the specified bit of the first data and the value of the specified bit of the second data are not equal, a determined result indicating that the slew rate of the output stage of the amplifier needs to be boosted is obtained and output;

when the value of the specified bit of the first data and the value of the specified bit of the second data are equal, a determined result indicating that the slew rate of the output stage of the amplifier does not need to be boosted is obtained and output;

an output terminal of the second level shifter 10613 is connected to the charging module 1062, and the second level shifter 10613 is configured to provide the PD control signal to the charging module.

An Rb terminal of the D flip-flop receives an inverted signal RSTB signal of a reset signal which is enabled at a low level and the D flip-flop is configured to reset the pattern detection circuit.

A trigger terminal of the D flip-flop receives an output-enable inverted signal OENB.

Specifically, referring to FIGS. 2 and 3, the example is illustrated as that 8-bits data Data<7:0> is provided to the input terminal and x=7, and here, D1<7> is a value of a Most Significant Bit (MSB) of the first data and D2<7> is a value of a MSB of the second data, that is, D1 is current data of the driver display IC (i.e. source driver IC) and D2 is the next data of the driver display IC, when they are different, it means there is a big change in the display pattern and the slew rate needs to be boosted, and specific to the circuit, D1<7> and D2<7> are compared by the pattern detection module 1061.

Specifically, in the comparing, the pattern detection module 1061 compares D1<7> and D2<7> at a rising edge (a transition from "0" to "1") of the OENB signal;

if D1<7>=D2<7>, the XOR gate circuit in the pattern detection module 1061 may output "0", and here, PD=0;

if D1<x>≠D2<x>, the pattern detection module 1061 may output "1", and here, PD=1, which belongs to the enable range of the pattern detection module 1061.

The pattern detection module 1061 inputs the value of the PD control signal to the charging module 1062, and if PD=0, it does not belong to the enable range and the slew rate does not need to be boosted; if PD=1, an enable signal is output by the pattern detection module here and it needs to be further determined whether the slew rate needs to be boosted by the charging module 1062 according to the current input data. If the current input data also belongs to the enable range of the charging module 1062, the slew rate of the output stage 1071 of the amplifier needs to be boosted, and the charging voltage input to the output stage 1071 of the amplifier is determined.

Optionally, the value of the specified bit of the first data and the value of the specified bit of the second data comprise:

a value D1<x> of a x-th bit of the first data and a value D2<x> of a x-th bit of the second data.

Specifically, the above case is a case in which only a value of one specified bit is specified, as shown in FIG. 2, the value D1<7> of the seventh bit of the first data and the value D2<7> of the seventh bit of the second data may be specified; the enable range of the pattern detection module 1061 may be adjusted when specifying values of different number of bits to be compared, and x may be adjusted according to the actual condition.

Optionally, the x-th bit is the MSB of the first data and/or the second data.

Specifically, referring to FIGS. 2 and 3, the example is illustrated as the data input terminal of 8-bits binary data, the input data Data<7:0> has a total of 8 bits, i.e., the 0-th bit through the 7-th bit, when x=7, i.e., the 7-th bit is specified, the MSB is specified, and the pattern detection module may fastly obtain the determined result by comparing the MSBs of the first data and the second data, and output the PD control signal.

Optionally, the charging module 1062 comprises a first control switch set 10621 and a second control switch set 10622;

the first control switch set 10621 is connected to a VDD voltage terminal, and connected to a OUTN port of the output stage 1071 of the amplifier after being connected to a first Proportional-Differential (PD) control switch 10623 in series;

the second control switch set 10622 is connected to a VSS voltage terminal, and connected to a OUTP port of the output stage 1071 of the amplifier after being connected to a second PD control switch 10624 in series;

the first PD control switch 10623 and the second PD control switch 10624 are configured to be controlled as closed and open according to the value of the PD control signal;

the first control switch set 10621 comprises multiple switches connected in series, and each of the multiple switches is controlled to be closed or open according to whether the current input data belongs to the enable range of the slew rate boosting module;

the second control switch set 10622 comprises multiple switches connected in series, and each of the multiple switches is controlled to be closed or open according to whether the inverted data of the current input data belongs to the enable range of the slew rate boosting module.

Specifically, when the value of the received control signal PD=1, i.e. when the pattern detection module 1061 inputs an enable signal to the charging module 1062, the slew rate of the output stage 1071 of the amplifier needs to be boosted.

Exemplarily, referring to the schematic structural diagram of the slew rate boosting module 106 as shown in FIG. 3, the example is illustrated as the 8-bits binary data, wherein 1062 is a schematic structure diagram of the charging module, the first switch set 10621 comprises series-connected switch sw<0>~switch sw<7> corresponding to DH<0>~DH<8> respectively. Specifically, when DH<x> of the current input data is equal to a preset value of a corresponding control switch of the first switch set, the switch is closed, otherwise open. Thus, only when each of values of DH<0>~DH<8> of the current input data is equal to the preset value, all switches of the first switch set may be closed, which belongs to the enable range of the charging module 1062.

The second switch set 10622 comprises series-connected switch sw<10>~switch sw<17> corresponding to DHB<0>~DHB<8> respectively. Specifically, when DHB<x> of the current input data is equal to a preset value of a corresponding control switch of the second switch set, the switch is closed, otherwise open. Thus, only when each of values of DHB<0>~DHB<8> of the inverted data of the current input data is equal to the preset value, all switches of the second switch set may be closed, which belongs to the enable range of the charging module 1062.

Each switch of the first switch set 10621 is controlled to be closed or open according to whether the current input data belong to the enable range of the slew rate boosting module. Exemplarily, when the enable range is DH<7:0>=00000000 or DHB<7:0>=00000000:

if DH<7:0>=00000001, the switch sw<0> is open, the first switch set cannot be switched on, and a circuit where the first switch set is located may not be connected, and DHB<7:0>=11111110, and the switches sw<11>~sw<17> are open, and a circuit where the second switch set is located may not be connected either, and the current input data DH<7:0>=00000001 does not belong to the enable range of the charging module 1062, and even though the control signal output by the pattern detection module is the enable signal PD=1, the slew rate of the output stage 1071 of the amplifier does not need to be boosted;

when DH<7:0>=00000000, DHB<7:0>=11111111, the switches sw<0>~sw<7> are closed, and all switches in the first switch set are closed;

when DH<7:0>=11111111, DHB<7:0>=00000000, the switches sw<10>~sw<17> are closed, and all switches in the second switch set are closed.

It should be noted, according to different actual use requirements, it is not necessary to determine each of bits of the current input data or the inverted data thereof, and one or more switches in the first switch set and the second switch set may be removed, for example, if the switches sw<0> and sw<10> corresponding to DH<0> and DHB<0> are removed, this will not affect the use of the entire slew rate boosting module.

Optionally, the charging module further comprises first and second Fast Internal-node Charging (FIC) control switches:

wherein the first FIC control switch, the first control switch set and the first PD control switch are connected in series between the VDD voltage terminal and the OUTN port of the output stage of the amplifier;

the second FIC control switch, the second control switch set and the second PD control switch are connected in series between the VSS voltage terminal and the OUTP port of the output stage of the amplifier;

the first FIC control switch and the second FIC control switch are controlled to be closed or open according to a FIC signal input from the outside;

the FIC signal is set according to a use state of the slew rate boosting circuit.

Specifically, each of the FIC control switches corresponds to one switch for determining whether to turn on the slew rate boosting module according to setting from a user; if it is set as FIC=0, the slew rate boosting module is in a turning off state, and only in a case of FIC=1, the slew rate boosting module is in an operating state. The set of FIC control switches may increase the controllability of the slew rate boosting module according to the example embodiment, and allow the user independently choose whether to turn on the slew rate boosting module, and turning off the boosting module may save power, and turning on the module may obtain a better display effect.

After FIC is re-changed to "0", RSTB may be changed to "0", and the slew rate boosting module may be initialized. The FIC signal applied from the outside and a timing of RSTB may be changed according to an actual designed environment.

The slew rate boosting circuit according to the example embodiment is further illustrated in conjunction with the above implementation.

Referring to FIG. 3, the first PD control switch 10623 and the first switch set 10621 are connected in series, and the second PD control switch 10624 and the second switch set 10622 are connected in series; and both of the PD control switches are controlled to be closed or open according to the PD control signal output by the pattern detection module 1061. Specifically, when PD=1, the PD control switches are closed; and when PD=0, the PD control switches are open.

The first switch set 10621 is connected to a charging voltage port VDD, and connected to the OUTN port of the output stage 1071 of the amplifier after being connected to the first PD control switch 10623 in series; the second switch set 10622 is connected to the charging voltage port VSS, and connected to the OUTP port of the output stage 1072 of the amplifier after being connected to the second PD control switch 10624 in series.

Specifically, when the FIC control switches are closed, and the slew rate boosting module is in a turning on state, only when all switches in the first switch set 10621 and the first PD control switch 10623 are in the closed state, the slew rate boosting module is in the enable state, and the charging voltage is determined as VDD, and the OUTN port of the output stage 1071 of the amplifier is charged by the VDD voltage terminal. Alternatively, when all switches in the second switch set 10622 and the second PD control switch 10624 are in the closed state, the charging voltage is determined to be VSS, and the OUTP port of the output stage 1071 of the amplifier is charged by the VSS voltage terminal.

Specifically, the voltage input to the charging voltage port may be adjusted according to the actual requirements, there are two charging voltage ports in FIG. 3 respectively providing the VDD voltage port and the VSS voltage port for different requirements.

Exemplarily, taking "8-bits binary Data<7:0>, the specified bits of the first data and the second data x=7, and the enable ranges of the slew rate boosting module are DH<7:0>=11111111 (i.e. gray value 255) and DH<7:0>=00000000 (i.e. gray value 0)" as the example:

1) Firstly, when the OENB signal is changed from "0" to "1", D1<7> and D2<7> are compared by the pattern detection module 1061, if the output result indicates they are the same, the PD signal is output as "0", the first PD control switch SW<8> and the second PD control switch SW<18> are open, and the slew rate boosting module is not enabled.

2) When D1<7>≠D2<7>, the PD signal is output as "1", the switch SW<8> and the switch SW<18> are closed.

3) When SW<8> and SW<18> are closed and when DH<7:0> is gray value 1-254 except for 11111111 (i.e. gray value 255) and 00000000 (i.e. gray value 0), at least one of SW<0>~SW<7>, SW<10>~SW<17> may be open, which does not belong to the enable range of the slew rate boosting module, and the slew rate boosting module is not enabled.

4) When DH<7:0>=11111111 (gray value 255) or DH<7:0>=00000000 (gray value 0), the switches SW<0>~SW<7>, SW<10>~SW<17> are closed.

5) If FIC="1" at this time, the slew rate boosting module is enabled. If DH<7:0>=11111111 (gray value 255), OUTN is connected to the VDD voltage terminal, and the OUTN port is charged by using VDD, and decreasing time of the slew rate (the voltage conversion rate) of the output terminal of the amplifier is reduced; if DH<7:0>=00000000 (gray value 0), OUTP is connected to the VSS terminal, and the OUTN port is charged by using VSS, and increasing time of the slew rate (the voltage conversion rate) of the output terminal of the amplifier is reduced.

Exemplarily, when the enable range of the slew rate boosting module is:

when PD=1 & FIC=1 & DH<7:0>=11111111, "OUTN=VDD"; and when PD=1 & FIC=1 & DHB<7:0>=11111111, "OUTP=VSS".

When D1<7:0>=11111111, and D2<7:0>=00000000; D1<7>≠D2<7>, PD=1, FIC=1, DH<7:0>=11111111, DHB<7:0>=00000000, then "OUTN=VDD".

When D1<7:0>=11111110, and D2<7:0>=00000001; D1<7>≠D2<7>, PD=1, FIC=1, DH<7:0>=11111110, DHB<7:0>=00000001, then the slew rate boosting module is not in the enable state.

When D1<7:0>=11111111, and D2<7:0>=00000001; D1<7>≠D2<7>, PD=1, FIC=1, DH<7:0>=11111111, DHB<7:0>=00000000, then "OUTN=VDD".

When D1<7:0>=11111111, and D2<7:0>=10000000; D1<7>=D2<7>, PD=0, FIC=1, DH<7:0>=11111111, DHB<7:0>=00000000, then the slew rate boosting module is not in the enable state.

When D1<7:0>=00000000, and D2<7:0>=01111111; D1<7>=D2<7>, PD=0, FIC=1, DH<7:0>=00000000, DHB<7:0>=11111111, then the slew rate boosting module is not in the enable state.

When D1<7:0>=00000000, and D2<7:0>=11111110; D1<7>≠D2<7>, PD=1, FIC=1, DH<7:0>=00000000, DHB<7:0>=11111111; then "OUTP=VSS".

When D1<7:0>=00000001, and D2<7:0>=11111110; D1<7>#D2<7>, PD=1, FIC=1, DH<7:0>=00000001, DHB<7:0>=11111110; then the slew rate boosting module is not in the enable state.

When D1<7:0>=00000000, and D2<7:0>=11111111; D1<7>≠D2<7>, PD=1, FIC=1, DH<7:0>=00000000, DHB<7:0>=11111111; then "OUTP=VSS".

Exemplarily, when the enable range of the slew rate boosting module is:

when PD=1 & FIC=1 & DH<7:0>=1111111x, "OUTN=VDD";

when PD=1 & FIC=1 & DHB<7:0>=1111111x, "OUTP=VSS".

When D1<7:0>=11111111, and D2<7:0>=00000000; D1<7>≠D2<7>, PD=1, FIC=1, DH<7:0>=11111111, DHB<7:0>=00000000; then "OUTN=VDD".

When D1<7:0>=11111110, and D2<7:0>=00000001; D1<7>≠D2<7>, PD=1, FIC=1, DH<7:0>=11111110, DHB<7:0>=00000001; then "OUTN=VDD".

When D1<7:0>=11111111, and D2<7:0>=00000001; D1<7>≠D2<7>, PD=1, FIC=1, DH<7:0>=11111111, DHB<7:0>=00000000; then "OUTN=VDD".

When D1<7:0>=11111111, and D2<7:0>=10000000; D1<7>=D2<7>, PD=0, FIC=1, DH<7:0>=11111111, DHB<7:0>=00000000; then the slew rate boosting module is not in the enable state and the slew rate does not need to be boosted.

When D1<7:0>=00000000, and D2<7:0>=01111111; D1<7>=D2<7>, PD=0, FIC=1, DH<7:0>=00000000, DHB<7:0>=11111111; then the slew rate boosting module is not in the enable state and the slew rate does not need to be boosted.

When D1<7:0>=00000000, and D2<7:0>=11111110; D1<7>≠D2<7>, PD=1, FIC=1, DH<7:0>=00000000, DHB<7:0>=11111111; then "OUTP=VSS".

When D1<7:0>=00000001, and D2<7:0>=11111110; D1<7>≠D2<7>, PD=1, FIC=1, DH<7:0>=00000001, DHB<7:0>=11111110; then "OUTP=VSS".

When D1<7:0>=00000000, and D2<7:0>=11111111; D1<7>≠D2<7>, PD=1, FIC=1, DH<7:0>=00000000, DHB<7:0>=11111111; then "OUTP=VSS".

Figure 5:
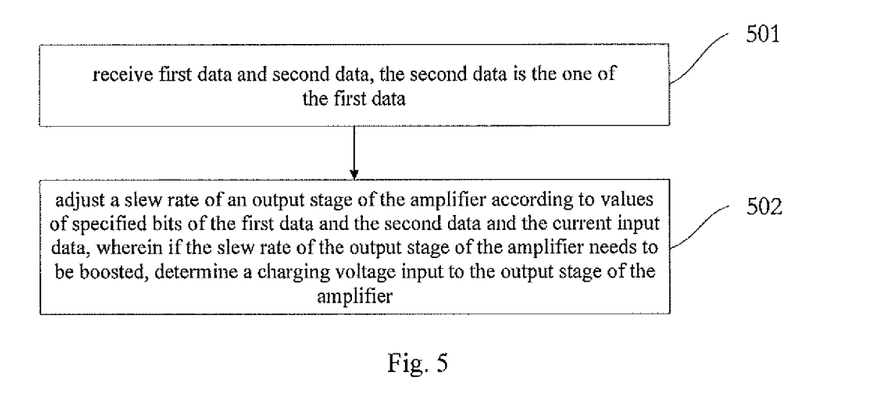
FIG. 5 is a flowchart of a slew rate boosting method according to an example embodiment.

In an aspect, referring to FIG. 5, the example embodiment of the disclosure provides a slew rate boosting method applied to the slew rate boosting circuit of the example embodiment of the disclosure, the method comprises:

step 501, receiving first data and second data, the second data is next to the first data;

step 502, adjusting a voltage of an output stage of the amplifier to boost a slew rate of the output stage of the amplifier according to a value of a specified bit of the first data, a value of a specified bit of the second data and current input data. A difference between the first data and the second data may be determined by comparing the value of the specified bit of the first data and the value of the specified bit of the second data; different number of the specified bits, a difference threshold between the first data and the second data may be increased or decreased, and the enable range of the slew rate boosting module may be adjusted through different number of the specified bits, i.e., by comparing the values of the different number of the specified bits of the first and second data. Only when each of the value of the specified bit of the first data, the value of the specified bit of the second data and the current input data meet the enable range of the slew rate boosting module, the slew rate of the output stage of the amplifier needs to be boosted, and the charging voltage input to the output stage of the amplifier may be determined.

Optionally, the adjusting of the voltage of the output stage of the amplifier to boost the slew rate of the output stage of the amplifier further comprises:

when the value of the specified bit of the first data and the value of the specified bit of the second data are not equal, determining that the slew rate of the output stage of the amplifier needs to be boosted;

when the value of the specified bit of the first data and the value of the specified bit of the second data are equal, determining that the slew rate of the output stage of the amplifier does not need to be boosted.

Optionally, the value of the specified bit of the first data and the value of the specified bit of the second data comprise:

a value D1<x> of an x-th bit of the first data and a value D2<x> of an x-th bit of the second data.

Optionally, the x-th bits are respectively the Most Significant Bits of the first data and the second data.

Only when D1<x>≠D2<x>, i.e., there is a big difference between the first data and the second data, and there is a big change in the display pattern, the slew rate of the output stage of the amplifier needs to be boosted.

Optionally, the adjusting of the voltage of the output stage of the amplifier to boost the slew rate of the output stage of the amplifier further comprises:

when the slew rate of the output stage of the amplifier needs to be boosted, if the current input data belongs to the enable range of the slew rate boosting module, determining the charging voltage input to the output stage of the amplifier.

When D1<x>≠D2<x>, there is a big difference between the first data and the second data and the slew rate of the output stage of the amplifier needs to be boosted, it also needs to determine whether the current input data belongs to the enable range of the slew rate boosting module, if it belongs to the enable range, the charging voltage input to the output stage of the amplifier is determined, and the specific input voltage is preset according to the enable range.

Optionally, the slew rate boosting method further comprises:

when Fast Internal-node Charging signal FIC=0, turning off the slew rate boosting module;

when the Fast Internal-node Charging signal FIC=1, turning on the slew rate boosting module.

Specifically, the FIC signal is set according to a use state of the slew rate boosting circuit, and whether turning on or turning off (disable) the slew rate boosting module may be independently determined by the user. Turning on the slew rate boosting module may pre-boost the output terminal of the amplifier and increase the slew rate (voltage conversion rate) of the output terminal of the amplifier when there is a big difference between the display drive data input before and after, so as to bring a better display effect; and turning off the boosting module may save power.

Figure 6:
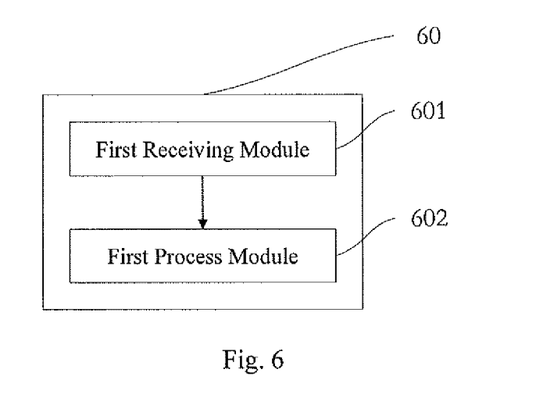
FIG. 6 is a schematic structural diagram of a slew rate boosting device according to an example embodiment.

Referring to FIG. 6, an example embodiment of the disclosure provides a slew rate boosting device 60 comprising:

a first receiving module 601 configured to receive first data and second data, the second data is next to the first data; and a first process module 602 configured to adjust a voltage of an output stage of the amplifier to boost a slew rate of the output stage of the amplifier according to a value of a specified bit of the first data, a value of a specified bit of the second data and the current input data, wherein the first process module 602 is further configured to determine a charging voltage input to the output stage of the amplifier if the slew rate of the output stage of the amplifier needs to be boosted.

Figure 7:
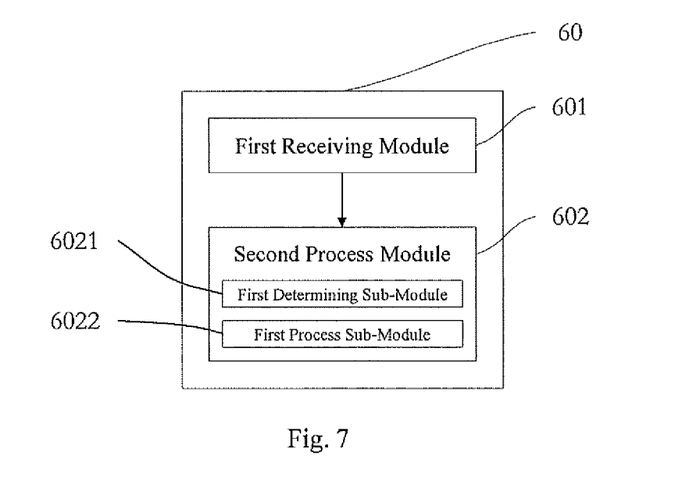
FIG. 7 is a schematic structural diagram of a slew rate boosting device according to an example embodiment.

Optionally, referring to FIG. 7, the first process module 602 comprises:

a first determining sub-module 6021 configured to determine that the slew rate of the output stage of the amplifier needs to be boosted when the value of the specified bit of the first data and the value of the specified bit of the second data are not equal; and to determine that the slew rate of the output stage of the amplifier does not need to be boosted when the value of the specified bit of the first data and the value of the specified bit of the second data are equal.

Optionally, referring to FIG. 7, the first process module 602 further comprises:

a first process sub-module 6022 configured to determine the charging voltage input to the output stage of the amplifier if the current input data belongs to the enable range of the slew rate boosting module, when the slew rate of the output stage of the amplifier needs to be boosted.

The slew rate boosting device 60 according to the example embodiment may have the same technical effects as the slew rate boosting circuit and the slew rate boosting method according to the example embodiments, and the details will be omitted to avoid redundancy.

In an aspect, an embodiment of the disclosure further provides a source driver chip comprising any one of the slew rate boosting circuits provided in the embodiments of the disclosure.

In an aspect, an embodiment of the disclosure further provides a display device comprising the source driver chip provided in the embodiment of the disclosure.

Figure 8:
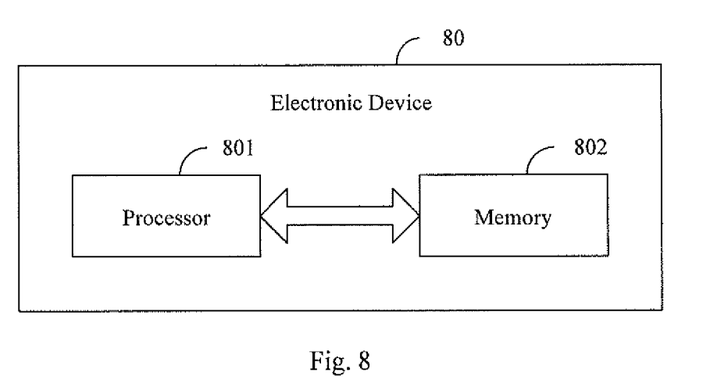
FIG. 8 is a schematic structural diagram of an electronic device according to an example embodiment.

Referring to FIG. 8, an embodiment of the disclosure further provides an electronic device 800 comprising a processor 801, a memory 802 and computer program stored in the memory 802 and run on the processor 801, that when executed by the processor 801, the various processes of the examples of the above slew rate boosting method are implemented and the same technical effects are achieved, and the details will be omitted to avoid redundancy.

An embodiment of the disclosure further provides a computer-readable storage medium storing computer program that, when executed by a processor, the various processes of the examples of the above slew rate boosting method are implemented and the same technical effects are achieved, and the details will be omitted to avoid redundancy. Wherein the computer-readable storage medium may include for example ROM (Read-Only Memory), RAM (Random Access Memory), magnetic disk or optical disk etc.

It should be noted that, the terms "include", "contain" or any other variants thereof used herein are intended to cover non-exclusive inclusion, so that a process, method, article or device including a series of elements not only includes those elements, but also includes other elements that are not explicitly listed, or further includes elements inherent to the process, method, article, or device. If there is no more limitation, an element defined by the sentence "including a . . . " does not exclude the existence of other same elements in the process, method, article, or device that includes the element.

Through the description of the above embodiments, those skilled in the art can clearly understand that the method of the above embodiments can be implemented by means of software and the necessary general hardware platform; of course, it can also be implemented by hardware, but in many cases the former is a better embodiment. Based on this understanding, the technical solution of the present disclosure essentially or the part that contributes to the field can be embodied in the form of a software product, and the computer software product is stored in a storage medium (such as ROM/RAM, magnetic disk, optical disk), and includes several instructions to allow a terminal (which may be a mobile phone, a computer, a server, an air conditioner, or a network device, etc.) execute the methods described in the various embodiments of the present disclosure.

Obviously, the foregoing embodiments are merely examples for clear description, and are not intended to limit the implementations. For those of ordinary skill in the art, other changes or modifications in different forms may be made on the basis of the above description. It is unnecessary and impossible to list all the implementations here. The obvious changes or modifications derived from this are still within the protection scope of the present disclosure.

THE ILLUSTRATION OF THE REFERENCE NUMBERS

101—first latch, 102—second latch, 103—first level shifter, 104—decoder, 105—Gamma voltage supplier, 106—slew rate boosting module, 107—amplifier;
1071—output stage of the amplifier, 1072—load stage of the amplifier, 1073—input stage of the amplifier;
1061—pattern detection module, 1062—charging module.

What is claimed is:

1. A slew rate boosting circuit, comprising:
a first latch configured to receive and store first data;
a second latch configured to receive and store second data, the second data being next to the first data;
a first level shifter configured to boost the first data to obtain a high voltage data signal;
an amplifier; and
a slew rate boosting module connected to the amplifier, the first level shifter, the first latch and the second latch, and configured to receive the high voltage data signal as current input data, and adjust a voltage of an output stage of the amplifier to boost a slew rate of the output stage of the amplifier according to a value of a specified bit of the first data, a value of a specified bit of the second data and the current input data.

2. The slew rate boosting circuit according to claim 1, wherein the slew rate boosting module comprises:
a pattern detection module connected to the first latch and the second latch, and configured to determine whether the slew rate of the output stage of the amplifier needs to be boosted according to the value of the specified bit of the first data and the value of the specified bit of the second data, and output a Proportional-Differential (PD) control signal according to the determined result; and
a charging module connected to an output terminal of the pattern detection module, an output terminal of the first level shifter and a charging voltage terminal, and configured to determine whether the slew rate of the output stage of the amplifier needs to be boosted according to the PD control signal and the current input data, and determine a charging voltage input to the output stage of the amplifier when determining that the slew rate of the output stage of the amplifier needs to be boosted.

3. The slew rate boosting circuit according to claim 2, wherein the pattern detection module comprises:
an XOR gate circuit, a D flip-flop and a second level shifter;

an input terminal of the XOR gate circuit is connected to the first latch and the second latch, and configured to determine whether the value of the specified bit of the first data and the value of the specified bit of the second data input therein are equal, and out the determined result;

an output terminal of the XOR gate circuit is connected to a D terminal of the D flip-flop, and an input terminal of the second level shifter is connected to a Q terminal of the D flip-flop, and the second level shifter is configured to determine whether the slew rate of the output stage of the amplifier needs to be boosted according to the determined result of the XOR gate circuit, wherein:

when the value of the specified bit of the first data and the value of the specified bit of the second data are not equal, a determined result indicating that the slew rate of the output stage of the amplifier needs to be boosted is obtained and output;

when the value of the specified bit of the first data and the value of the specified bit of the second data are equal, a determined result indicating that the slew rate of the output stage of the amplifier does not need to be boosted is obtained and output;

an output terminal of the second level shifter is connected to the charging module, and configured to provide the PD control signal to the charging module.

4. The slew rate boosting circuit according to claim 1, wherein the value of the specified bit of the first data and the value of the specified bit of the second data respectively comprise:

a value D1<x> of an x-th bit of the first data, and a value D2<x> of an x-th bit of the second data.

5. The slew rate boosting circuit according to claim 4, wherein the x-th bits are respective Most Significant Bits of the first data and the second data.

6. The slew rate boosting circuit according to claim 2, wherein the charging module comprises a first control switch set and a second control switch set;

the first control switch set is connected to a VDD voltage terminal, and connected to a OUTN port of the output stage of the amplifier after being connected to a first Proportional-Differential (PD) control switch in series;

the second control switch set is connected to a VSS voltage terminal, and connected to a OUTP port of the output stage of the amplifier after being connected to a second PD control switch in series;

the first PD control switch and the second PD control switch are configured to be closed and open according to a value of the PD control signal;

the first control switch set comprises multiple switches connected in series, and each of the switches is configured to be closed or open according to whether the current input data belongs to an enable range of the slew rate boosting module;

the second control switch set comprises multiple switches connected in series, and each of the switches is configured to be closed or open according to whether inverted data of the current input data belongs to the enable range of the slew rate boosting module.

7. The slew rate boosting circuit according to claim 6, wherein the charging module further comprises first and second Fast Internal-node Charging (FIC) control switches:

wherein the first FIC control switch, the first control switch set and the first PD control switch are connected in series between the VDD voltage terminal and the OUTN port of the output stage of the amplifier;

the second FIC control switch, the second control switch set and the second PD control switch are connected in series between the VSS voltage terminal and the OUTP port of the output stage of the amplifier;

the first FIC control switch and the second FIC control switch are controlled to be closed or open according to a FIC signal input from outside; and the FIC signal is set according to a use state of the slew rate boosting circuit.

8. A slew rate boosting method applied to the slew rate boosting circuit according to claim 1, comprising:

receiving first data and second data, the second data being next to the first data; and adjusting a voltage of an output stage of the amplifier to boost a slew rate of the output stage of the amplifier according to a value of a specified bit of the first data, a value of a specified bit of the second data and the current input data.

9. The slew rate boosting method of claim 8, wherein the adjusting of the voltage of the output stage of the amplifier to boost the slew rate of the output stage of the amplifier further comprises:

when the value of the specified bit of the first data and the value of the specified bit of the second data are not equal, determining that the slew rate of the output stage of the amplifier needs to be boosted;

when the value of the specified bit of the first data and the value of the specified bit of the second data are equal, determining that the slew rate of the output stage of the amplifier does not need to be boosted.

10. The slew rate boosting method of claim 9, wherein the adjusting of the voltage of the output stage of the amplifier to boost the slew rate of the output stage of the amplifier further comprises:

when the slew rate of the output stage of the amplifier needs to be boosted, if the current input data belongs to the enable range of the slew rate boosting module, determining a charging voltage input to the output stage of the amplifier.

11. A slew rate boosting device, comprising:

a first receiving module configured to receive first data and second data, the second data being next to the first data; and a first process module configured to adjust a voltage of an output stage of an amplifier to boost a slew rate of the output stage of the amplifier according to a value of a specified bit of the first data, a value of a specified bit of the second data and current input data.

12. An electronic device, comprising: a processor and a memory which stores computer instructions that, when executed by the processor, cause the processor perform the slew rate boosting method according to claim 8.

13. A source driver chip comprising the slew rate boosting circuit according to claim 1.

14. A display device comprising the source driver chip according to claim 13.

15. A slew rate boosting method applied to the slew rate boosting circuit according to claim 2, comprising:

receiving first data and second data, the second data being next to the first data; and adjusting a voltage of an output stage of the amplifier to boost a slew rate of the output stage of the amplifier according to a value of a specified bit of the first data, a value of a specified bit of the second data and the current input data.

16. A slew rate boosting method applied to the slew rate boosting circuit according to claim 4, comprising:

receiving first data and second data, the second data being next to the first data; and adjusting a voltage of an output stage of the amplifier to boost a slew rate of the output stage of the amplifier according to a value of a specified bit of the first data, a value of a specified bit of the second data and the current input data.

17. A slew rate boosting method applied to the slew rate boosting circuit according to claim 5, comprising:

receiving first data and second data, the second data being next to the first data; and adjusting a voltage of an output stage of the amplifier to boost a slew rate of the output stage of the amplifier according to a value of a specified bit of the first data, a value of a specified bit of the second data and the current input data.

18. A source driver chip comprising the slew rate boosting circuit according to claim 2.

19. A source driver chip comprising the slew rate boosting circuit according to claim 4.

20. A source driver chip comprising the slew rate boosting circuit according to claim 5.

\* \* \* \* \*